US006924588B2

(12) United States Patent
Okazaki et al.

(10) Patent No.: US 6,924,588 B2
(45) Date of Patent: Aug. 2, 2005

(54) PIEZOELECTRIC CRYSTAL MATERIAL AND PIEZOELECTRIC RESONATOR (75) Inventors: Masanobu Okazaki, Saitama (JP); Morio Onoue, Tokyo (JP); Hitoshi Sekimoto, Kanagawa (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/772,211

(22) Filed: Feb. 4, 2004

(65) Prior Publication Data
US 2004/0155305 A1 Aug. 12, 2004

(30) Foreign Application Priority Data
Feb. 4, 2003 (JP) ......................................... 2003-026600

(51) Int. Cl.[7] .......................... H01L 41/04; H01L 41/16; H01L 41/187
(52) U.S. Cl. ....................... 310/367; 310/360; 310/368; 310/358; 310/357; 252/62.9 PZ; 252/62.9 R; 117/70
(58) Field of Search ............................... 310/357, 358, 310/360, 367, 368; 252/62.9 R, 62.9 PZ (56) References Cited

U.S. PATENT DOCUMENTS

| 3,787,743 | A |   | 1/1974  | Gibert et al. ............... 310/352 |
| 4,126,731 | A | * | 11/1978 | Nishizawa et al. ......... 428/446 |
| 4,481,069 | A | * | 11/1984 | Chai et al. .................... 117/71 |
| 4,578,146 | A | * | 3/1986  | Chai et al. ...................... 117/1 |
| 5,369,327 | A | * | 11/1994 | Wallnofer et al. ....... 310/313 A |
| 5,557,968 | A | * | 9/1996  | Krempl et al. ................ 73/497 |
| 6,491,753 | B2| * | 12/2002 | Krempl et al. ................ 117/68 |
| 6,571,443 | B2| * | 6/2003  | Lally et al. ................. 29/25.35 |

FOREIGN PATENT DOCUMENTS

| JP | 51-97394 | 8/1976 | ............ H03H/9/14 |
| JP | 08153915 A | * 6/1996 | ........... H01L/41/22 |
| WO | WO 2004042370 A1 | * 5/2004 | ............. G01N/5/00 |

OTHER PUBLICATIONS

Detaint, J., Properties of at Cut Fallium Phosphate Resonators, IEEE International Frequency Control Symposium and Exhibition, 2000, P. 145.*
Detaint, J., Gallum Phosphate Plane Resonators and Filters, IEEE International Frequency Control Symposium and PDA Exhibition, Sep. 2003, P. 679.*
Henry, E., A Comprehensive Mapping of SAW Properties on Gallium Orthophosphate (GaPO4), 1999 Joint Meeting EFTF–IEEE IFCS, Jan. 1999, P. 811.*
Delmas, L., Temperature–Compensated Cuts for Vibrating Beam Resonators of Galliym Orthophosphate GaPO4, IEEE International Frequency Control Symposium and PDA Exhibiiton, Sep. 2003, P.663.*
Krempl, P.W., Quartz Homeotypic Gallium Orthophosphate—A New High Tech Piezoelectric Material, IEEE, 1994, P. 949.*

(Continued)

*Primary Examiner*—Darren Schuberg
*Assistant Examiner*—J. Aguirrechea
(74) *Attorney, Agent, or Firm*—Choate, Hall & StewartLLP (57) ABSTRACT

In a gallium phosphate crystal, a crystallographic Y-axis and a Z-axis that have been rotated about an X-axis counterclockwise through an angle α is referred to as a Y'-axis and a Z'-axis, respectively, where the angle α is in a range from 10° to 20°. A piezoelectric crystal material made of gallium phosphate is provided as a plate-shaped member which is elongate in an X-axis direction and cut from the gallium phosphate crystal parallel to an X-Z' crystal plane of the gallium phosphate, and the plate-shaped member has sides parallel to an axis that is obtained by rotating the Y'-axis counterclockwise about the X-axis in an angular range from 1° to 3°.

8 Claims, 6 Drawing Sheets

OTHER PUBLICATIONS

Worsch, P., GaPO4 Crystals for Sensor Applications, IEEE, Jan. 2002, P. 589.*

Zarka, A., Studies of GaPO4 Crystals and Resonators, 1996 IEEE International Frequency Control Symposium, Aug. 1996, P. 66.*

J. Détaint, B. Capelle, O. Cambon, E. Philippot; Properties of at Cut Gallium Phosphate Resonators; 2000 IEEE/EIA International Frequency Control Symposium and Exhibition, pp. 145–157, XP010525538.

* cited by examiner

PIEZOELECTRIC CRYSTAL MATERIAL AND PIEZOELECTRIC RESONATOR

BACKGROUND OF THE INVENTION

1. Field of the Invention

The present invention relates to a piezoelectric crystal material, and more particularly to a piezoelectric crystal material of gallium phosphate ($GaPO_4$) and a piezoelectric resonator, that is, a piezoelectric unit, having such a piezoelectric crystal material.

2. Description of the Related Art

Crystals having a piezoelectric effect are widely used in electronic components such as piezoelectric resonators, for example. Various crystals having a piezoelectric effect are known in the art. One of the known crystals is gallium phosphate crystal. Gallium phosphate, which is also referred as gallium orthophosphate, has excellent properties in that it does not cause a crystal phase transition upon a temperature rise and can be used as a piezoelectric crystal member in a wide temperature range up to about 900° C. The use of gallium phosphate as a piezoelectric sensor material is also promising because it has a larger electromechanical coupling coefficient than quartz crystal.

Figure 1:
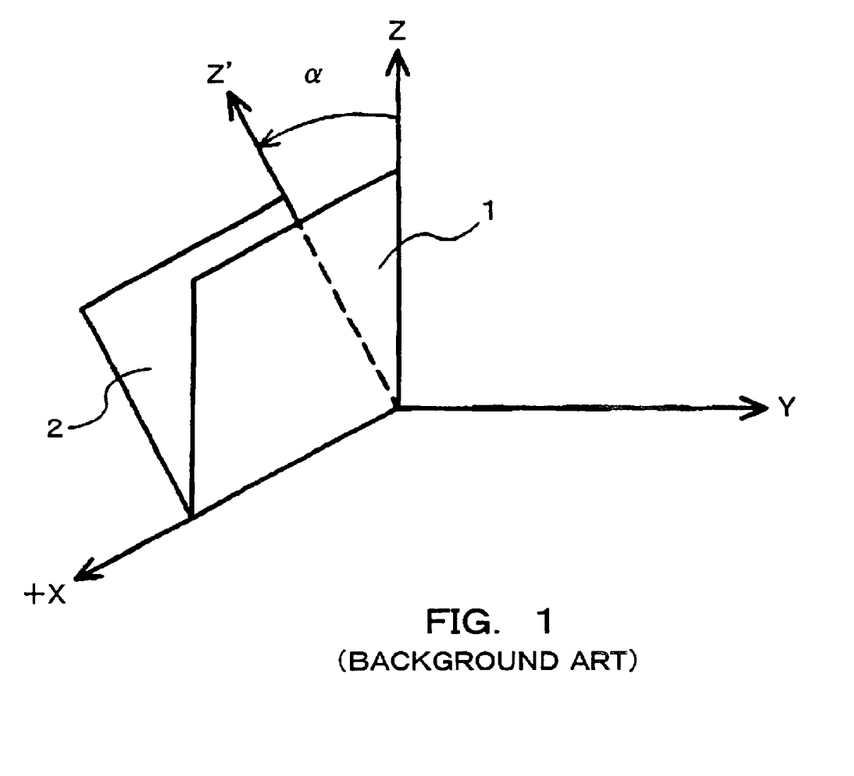
FIG. 1 is a diagram showing an angle at which a resonator made of a gallium phosphate crystal is cut from the bulk of the crystal.

Gallium phosphate has a crystalline structure that is homeotypic to quartz crystal. Based on the crystalline structure of gallium phosphate, three axes, X, Y, Z, that are perpendicular to each other are crystallographically defined for gallium phosphate crystals. If a gallium phosphate crystal is used as a piezoelectric resonator or a piezoelectric unit, then, as shown in FIG. 1, plate 1 having an X-Z plane as a principal surface of the gallium phosphate crystal is considered, and the use of rotated Y-plate 2 having a principal plane parallel to a Y-Z' plane, which is obtained by rotating plate 1 about an X-axis in a-Y-axis direction through a certain angle α, is taken into consideration. A Z'-axis is an axis that is obtained by rotating a Z-axis about the X-axis through the angle α. Although, as with a piezoelectric quartz crystal, the gallium phosphate crystal can have various oscillation modes as with a piezoelectric quartz crystal, the vibration mode of such a rotated Y-plate is a thickness shear vibration mode.

Figure 2:
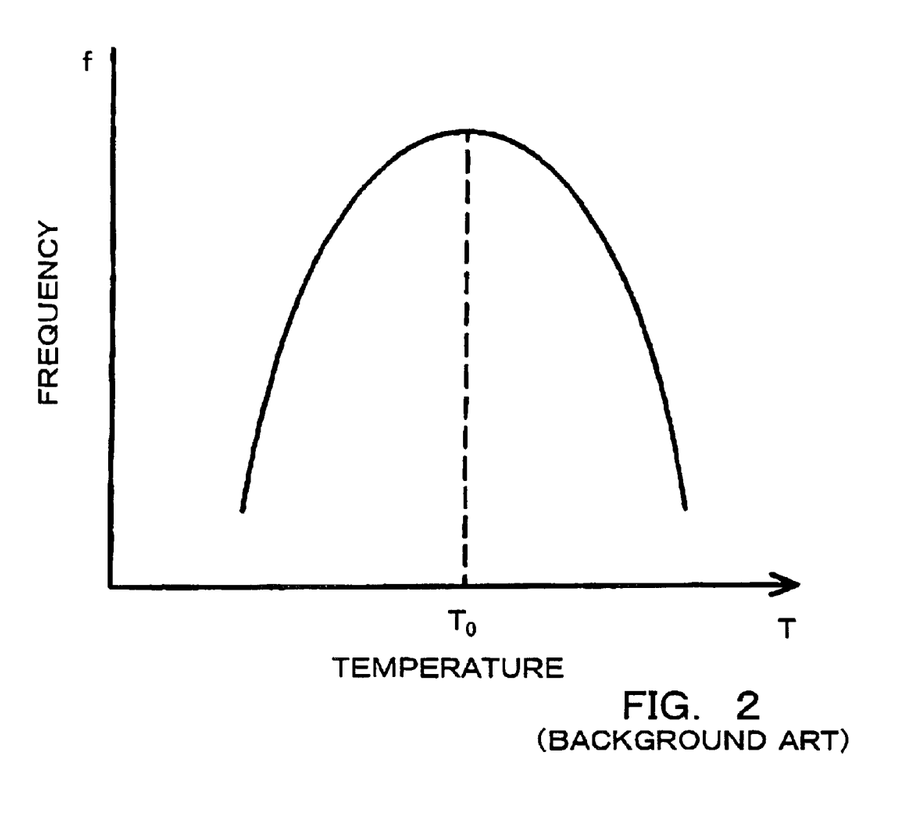
FIG. 2 is a graph showing the relationship between the rotational angle for cutting out a rotated Y-plate and the peak temperature on a frequency vs. temperature characteristic curve for a resonator made of a gallium phosphate crystal.

Rotated Y-plate 2 is cut from a gallium phosphate crystal, and shaped into a thin-plate resonator piece. Excitation electrodes are formed the opposite surfaces of the thin-plate resonator piece, and a voltage is applied between both excitation electrodes to excite piezoelectric vibrations in the thin-plate resonator piece. The resonator comprising the rotated Y-plate of gallium phosphate has a frequency vs. temperature characteristic curve which is an upwardly convex quadratic function curve representing its resonant frequency, as shown in FIG. 2. A peak temperature $T_0$ of the frequency vs. temperature characteristic curve, i.e., a temperature at which the resonant frequency is maximum on the frequency vs. temperature characteristic curve, varies depending on the rotational angle a which indicates how much the Z-axis has been rotated about the X-axis to produce the Z'-axis of the rotated Y-plate. With piezoelectric resonators of gallium phosphate, the peak temperature $T_0$ may be made higher than the normal temperature (25° C.) by changing the rotational angle α. For example, a piezoelectric resonator which has a peak temperature $T_0$ of 100° C., for example, can be realized. This indicates that it is possible to provide a piezoelectric resonator whose resonant frequency is stable near the high peak temperature $T_0$, and a piezoelectric resonator of gallium phosphate can advantageously be used as a reference frequency source in oscillators for use in high-temperature environments.

However, if attempts are made to reduce the plate surface area of a thin-plate resonator piece shaped from a rotated Y-plate of gallium phosphate for producing practical piezoelectric resonators, then the basis of a thickness shear vibration mode which requires the plate surface area to be sufficiently large with respect to the thickness is liable to be lost. If the plate surface area is not sufficiently large, then the piezoelectric resonator generates strong unwanted responses (i.e., auxiliary vibrations) in addition to the objective principal vibrations, and the intensive auxiliary vibrations cause the frequency vs. temperature characteristic curve of the piezoelectric resonator to deviate from a smooth quadratic function curve, and also change the peak temperature. If a piezoelectric resonator having a thickness shear vibration mode comprises a piezoelectric quartz crystal, then Japanese laid-open patent publication No. 51-97394 (JP, 51-97394, A) discloses that the plate surface area has to be sufficiently large with respect to the thickness.

For reducing the size of the resonator of the type described above, it is the general practice to make the resonator slender in the direction of the displacement of thickness shear vibrations, i.e., to make the resonator slender in the shape of a rectangular shape that is elongate in the X-axis direction. However, the unwanted responses that are generated as described above make it difficult to select appropriate resonator configurations, resulting in difficulty to reduce the resonator size.

SUMMARY OF THE INVENTION

It is an object of the present invention to provide a piezoelectric crystal material consisting of gallium phosphate which, even when processed into a small resonator piece, is capable of preventing unwanted responses from being generated and also of achieving a frequency vs. temperature characteristic curve with a smooth quadratic function curve.

Another object of the present invention to provide a piezoelectric resonator made of a gallium phosphate crystal which, even if small in size, is capable of preventing unwanted responses from being generated and also of achieving a frequency vs. temperature characteristic curve with a smooth quadratic function curve.

The inventors of the present invention have presumed, as a result of research efforts made over many years about resonators of a gallium phosphate crystal, that intensive unwanted responses are generated because profile shear vibrations transverse to thickness shear vibrations are coupled to the objective thickness shear vibrations. Based on the assumption, the inventors have further studied the subject, and completed the present invention.

According to the present invention, the first object can be achieved by a piezoelectric crystal material of gallium phosphate, wherein an angle α is defined to be in a range from 10° to 20°, a crystallographic Y-axis and a Z-axis of a gallium phosphate crystal that have been rotated counterclockwise about an X-axis through the angle α is referred to as a Y'-axis and a Z'-axis, respectively, and wherein the piezoelectric crystal material is provided as a plate-shaped member which is elongate in the X-axis direction and cut from the gallium phosphate crystal parallel to the X-Z' crystal plane of gallium phosphate, and the plate-shaped member has sides (i.e., X-Y' plane) parallel to an axis that is obtained by rotating the Y'-axis counterclockwise about the X-axis in an angular range from 1° to 3°.

The piezoelectric crystal material is preferably of a slender rectangular shape that is elongate the X-axis direction. If the plate-shaped member has a thickness t and a width w in a direction perpendicular to the X-axis, then a side ratio w/t between the thickness t and the width w should preferably satisfy $3 \leq w/t \leq 20$.

According to the present invention, the second object can be achieved by a piezoelectric resonator comprising a piezoelectric crystal material as described above, and electrodes disposed respectively on opposite principal surfaces of the piezoelectric crystal material, for exciting piezoelectric vibrations in the piezoelectric crystal material.

The piezoelectric crystal material according to the present invention is provided as a so-called rotated Y-plate of gallium phosphate, and can obtain a desired peak temperature depending on the rotational angle α of the rotated Y-plate.

According to the present invention, furthermore, by tilting the sides of the slender plate-shaped member of the piezoelectric crystal material through an angle ranging from 1° to 3°, when the piezoelectric crystal material is used as a resonator piece, the resonator piece, even if reduced in size, is capable of preventing unwanted responses from being generated and also providing a frequency vs. temperature characteristic curve which comprises a smooth quadratic function curve.

DETAILED DESCRIPTION OF THE PREFERRED EMBODIMENT

Figure 3:
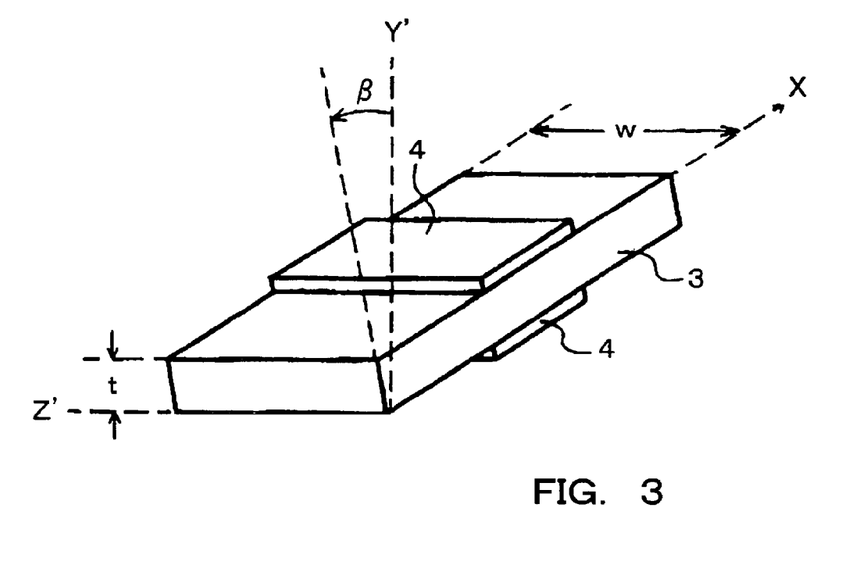
FIG. 3 is a perspective view of a resonator piece made of a gallium phosphate crystal according to an embodiment of the present invention.

As shown in FIG. 3, piezoelectric resonator 3 according to an embodiment of the present invention is cut from a gallium phosphate crystal, and employs a rotated Y-plate of gallium phosphate as a piezoelectric crystal material.

As shown in FIG. 1, a crystallographic Y-axis and a Z-axis of a gallium phosphate crystal that have been rotated counterclockwise about an X-axis through an angle α is referred to as a Y'-axis and a Z'-axis, respectively.

Piezoelectric resonator 3 has a resonator piece comprising a plate-shaped member that is cut from an X-Z' crystal plane that is produced by rotating an X-Z plane of a gallium phosphate crystal to the left (i.e., counterclockwise) about the X-axis through the angle α. With resonator 3 according to the present embodiment, the angle α is in an angular range from 10° to 20°. The plate-shaped member has a planar rectangular shape which is elongate in the X-axis direction, and has a width in the Z'-axis direction and a thickness in the Y'-axis direction. In FIG. 3, the width of the plate-shaped member is represented by w and the thickness thereof by t. Piezoelectric resonator 3, i.e., the plate-shaped member, has sides (i.e., X-Y') tilted to the left through 1° to 3° as viewed from the +X-axis. The tilted angle is represented by β in FIG. 3. In other words, the sides of the plate-shaped member extend parallel to an axis that is obtained by rotating the Y'-axis counterclockwise about the X-axis in an angular range from 1° to 3°.

Resonator 3 has a pair of confronting electrodes 4 formed substantially centrally on respective opposite principal surfaces of the plate-like member for exciting thickness shear vibrations in the plate-like member.

Figure 4:
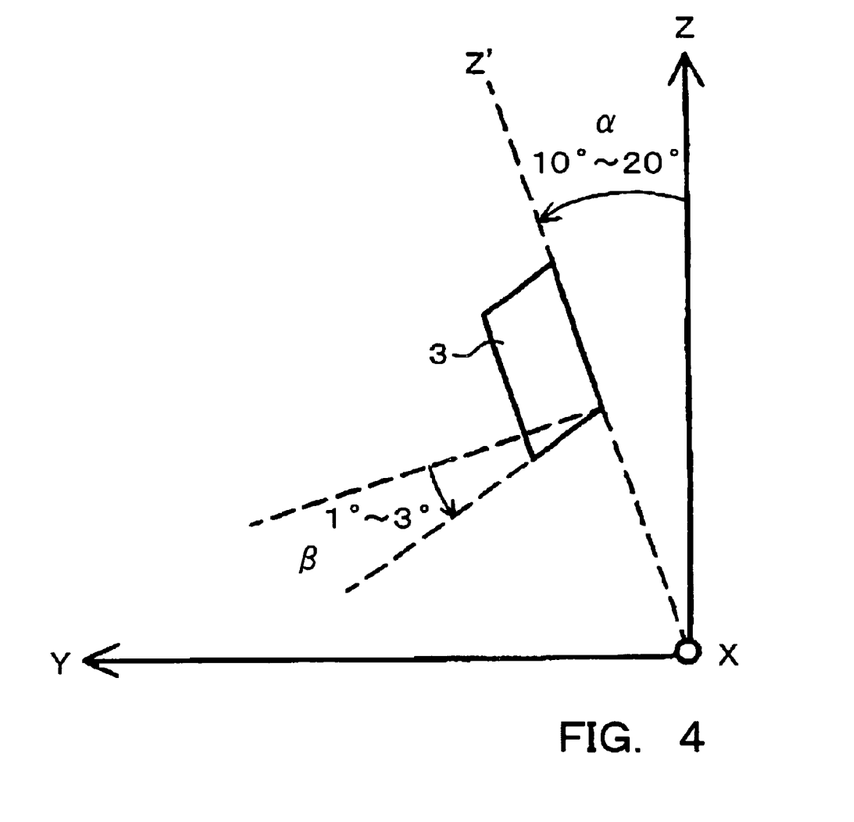
FIG. 4 is a front elevational view of the resonator piece shown in FIG. 3.

FIG. 4 shows in front elevation piezoelectric resonator 3 as viewed from the positive direction along the X-axis.

The relationship between the rotational angle a of the rotated Y-plate of gallium phosphate from the Z-axis and the peak temperature on the frequency vs. temperature characteristic curve of piezoelectric resonator 3 will be described below.

Figure 5:
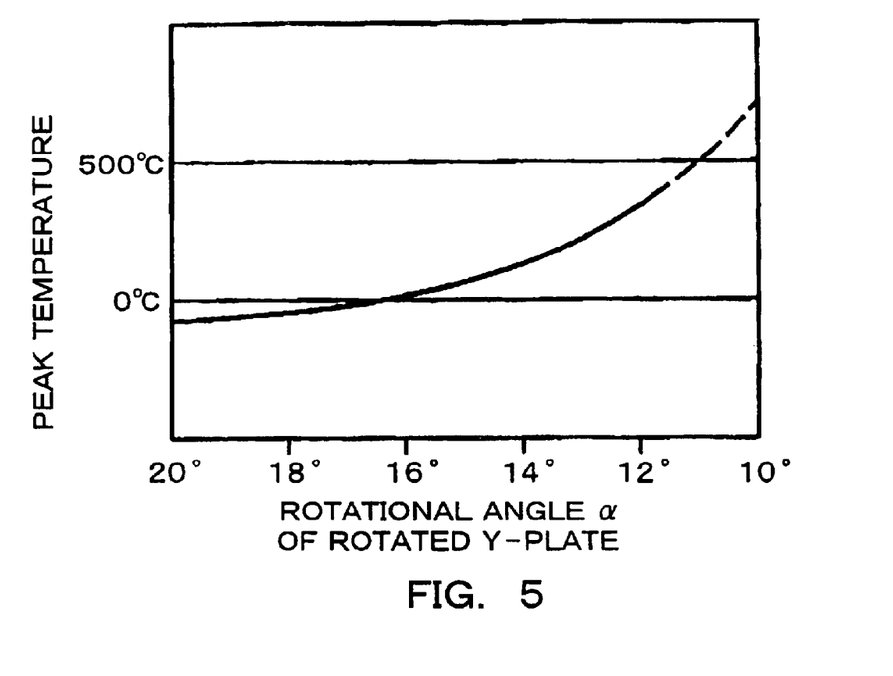
FIG. 5 is a graph showing the relationship between the rotational angle α of a rotated Y-plate and the peak temperature for gallium phosphate.

As shown in FIG. 5, the peak temperature of the rotated Y-plate of gallium phosphate varies depending on the rotational angle α. The peak temperature is about 600° C. when the rotational angle α is 10°. As the rotational angle α increases, the peak temperature drops progressively. When the rotational angle α is 15°, the peak temperature is about 25° C., and when the rotational angle α is 20°, the peak temperature is about −100° C. Therefore, if the practical peak temperature range of a thickness shear piezoelectric resonator of gallium phosphate is from −100° C. to 600° C., then the rotational angle α may be in the range from 10° to 20°.

Next, the reasons for tilting the sides (i.e., X-Y' plane) of piezoelectric resonator 3 as the plate-shaped member through the angle β will be described below.

The inventors of the present invention cut a plate-like rectangular member that is elongate in the X-axis direction from a rotated Y-plate whose peak temperature on an upwardly convex frequency vs. temperature characteristic curve for a piezoelectric resonator of gallium phosphate is about 25° C., i.e., a crystal plate whose rotational angle α is 15°. Then, the inventors tilted and polished longitudinal sides of the plate-shaped member. Specifically, the inventors polished the longitudinal sides of the plate-shaped member at various different tilted angles, completed piezoelectric resonators, and evaluated their vibrating characteristics. As a result, the inventors found that a piezoelectric resonator produced by tilting the sides of the plate-shaped member to the left through 1° to 3° as viewed in the +X-axis direction (the positive direction along the X-axis) and polishing the tilted sides generated so small unwanted responses that they caused practically no problems. Most preferably, almost no unwanted responses were generated when the tilted angle of the sides was 1.5°. It has been discovered that good vibration characteristics can be achieved if the angle β is in the range from 1° to 3°. According to the present invention, therefore, the angle β is in the range of $1° \leq \beta \leq 3°$.

Figure 6:
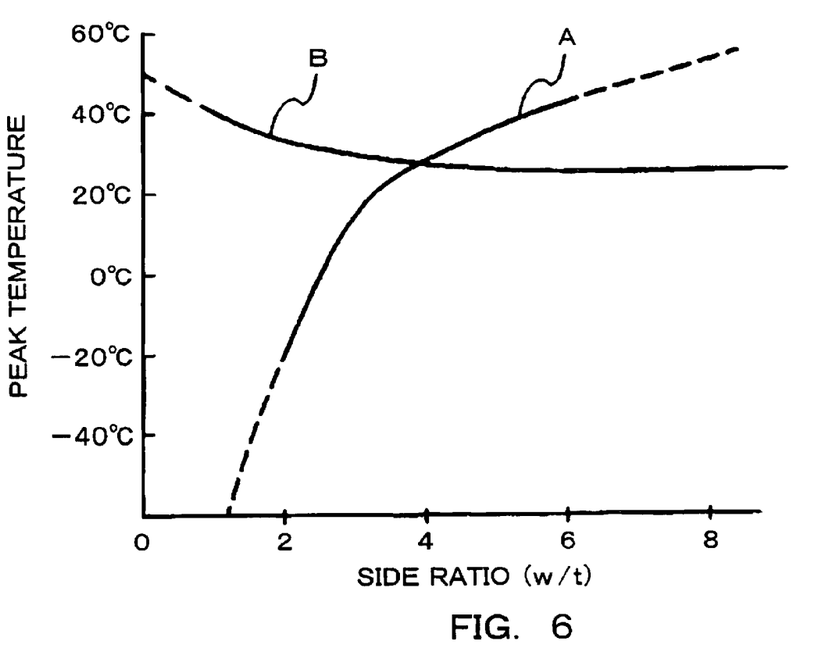
FIG. 6 is a graph showing how the peak temperature changes as a side ratio (w/t) changes with respect to each of a resonator whose side is vertically processed and another resonator whose side is obliquely processed.

The inventors also investigated the relationship between the side ratio (w/t) of the width w to the thickness t and the peak temperature with respect to a resonator having an angle α of 15° and an angle β of 1.5° and another resonator having an angle α of 15° and an angle β of 0, i.e., untilted sides. The results of the investigation are shown in FIG. 6. In FIG. 6, the horizontal axis represents the side ratio (w/t) and the vertical axis the peak temperature on the frequency vs. temperature characteristic curve. The results of the resonator with the vertical sides are indicated by a curve A, and the results of the resonator with the sides tilted 1.5° are indicated by a curve B.

As can be seen from FIG. 6, when the side ratio of the resonator with the vertical sides was changed, the peak temperature varied greatly. However, the resonator with the sides tilted 1.5° achieved a substantially constant peak temperature (about 25° C.) if the side ratio was 3 or greater. It can be understood from these results that the piezoelectric resonator according to the present invention should preferably have a side ratio (w/t) of 3 or greater.

Furthermore, since the direction of the displacement of thickness shear vibrations in a gallium phosphate crystal is the X-axis direction, the resonator can be reduced in size by reducing its dimensions along the width without significantly impairing the vibration characteristics. If the side ratio (w/t) exceeded 20, the ability to improve the vibration characteristics by tilting the sides of the resonator is reduced. If the side ratio increases, the resonator has its size increased. According to the present invention, therefore, the side ratio of the slender rectangular resonator that is elongate in the X-axis direction should preferably be in the range from 3 to 20.

What is claimed is:

1. A piezoelectric crystal material of gallium phosphate, wherein an angle $\alpha$ is defined to be in a range from 10° to 20°, a crystallographic Y-axis and a crystallographic Z-axis of a gallium phosphate crystal that have been rotated counterclockwise about an X-axis through the angle $\alpha$ is referred to as a Y'-axis and a Z'-axis, respectively, wherein said piezoelectric crystal material is provided as a plate-shaped member which is elongate in an X-axis direction and cut from the gallium phosphate crystal parallel to an X-Z' crystal plane of gallium phosphate, and said plate-shaped member has sides parallel to an axis that is obtained by rotating said Y'-axis counterclockwise about said X-axis in an angular range from 1° to 3°.

2. The piezoelectric crystal material according to claim 1, wherein said piezoelectric crystal material is formed in a rectangular shape that is elongate in said X-axis direction.

3. The piezoelectric crystal material according to claim 2, wherein said plate-shaped member has a thickness t and a width w in a direction perpendicular to said X-axis, said thickness t and said width w satisfying $3 \leq w/t \leq 20$.

4. The piezoelectric crystal material according to claim 2, wherein said angle $\alpha$ is 15°.

5. The piezoelectric crystal material according to claim 4, wherein the sides of said plate-shaped member is parallel to an axis that is obtained by rotating said Y'-axis about said X-axis in said Z'-axis direction through an angle of 1.5°.

6. A piezoelectric resonator of gallium phosphate, comprising:

a piezoelectric crystal material; and electrodes disposed respectively on opposite principal surfaces of said piezoelectric crystal material, for exciting piezoelectric vibrations in said piezoelectric crystal material;

wherein an angle $\alpha$ is defined to be in a range from 10° to 20°, a crystallographic Y-axis and a crystallographic Z-axis of a gallium phosphate crystal that have been rotated counterclockwise about an X-axis through the angle $\alpha$ is referred to as a Y'-axis and a Z'-axis, respectively, and wherein said piezoelectric crystal material is provided as a plate-shaped member which is elongate in an X-axis direction and cut from the gallium phosphate crystal parallel to an X-Z' crystal plane of the gallium phosphate, and said plate-shaped member has sides parallel to an axis that is obtained by rotating said Y'-axis counterclockwise about said X-axis in an angular range from 1° to 3°.

7. The piezoelectric resonator according to claim 6, wherein said piezoelectric crystal material is formed in a rectangular shape that is elongate in said X-axis direction.

8. The piezoelectric resonator according to claim 7, wherein said plate-shaped member has a thickness t and a width w in a direction perpendicular to said X-axis, said thickness t and said width w satisfying $3 \leq w/t \leq 20$.

* * * * *

UNITED STATES PATENT AND TRADEMARK OFFICE
CERTIFICATE OF CORRECTION

PATENT NO.     : 6,924,588 B2
DATED          : August 2, 2005
INVENTOR(S)    : Masanobu Okazaki, Morio Onoe and Hitoshi Sekimoto It is certified that error appears in the above-identified patent and that said Letters Patent is hereby corrected as shown below:

<u>Title page,</u>
Item [75], Inventors, please change "Morio Onoue" to -- Morio Onoe --.

Signed and Sealed this

Sixth Day of December, 2005

JON W. DUDAS
*Director of the United States Patent and Trademark Office*